United States Patent [19]

Kim

[11] Patent Number: 5,603,169
[45] Date of Patent: Feb. 18, 1997

[54] BUBBLER FOR SOLID METAL-ORGANIC PERCURSORS

[75] Inventor: Dae-sig Kim, Kyungki-do, Rep. of Korea

[73] Assignee: Samsung Electronics Co. Ltd., Suwon, Rep. of Korea

[21] Appl. No.: 536,819

[22] Filed: Sep. 29, 1995

[30]   Foreign Application Priority Data

Sep. 30, 1994 [KR] Rep. of Korea ............... 94-25196

[51] Int. Cl.$^6$ ............................................. F26B 17/00
[52] U.S. Cl. ................................... 34/587; 34/591
[58] Field of Search .................. 34/145, 589, 218, 34/227, 587, 591

[56]   References Cited

U.S. PATENT DOCUMENTS

| | | | |
|---|---|---|---|
| 3,308,558 | 3/1967 | Orlando | 34/218 |
| 3,866,332 | 2/1975 | Hertz | 34/587 |
| 5,343,633 | 9/1994 | Wang et al. | 34/92 |

*Primary Examiner*—John M. Sollecito
*Assistant Examiner*—Steve Gravini
*Attorney, Agent, or Firm*—Seidel Gonda Lavorgna & Monaco, P.C.

[57]   ABSTRACT

A bubbler for solid metal-organic precursors is described. The bubbler includes a bubbler body, a carrier gas feed tube, an exhaust tube, a compressing plate and a pair of porous thin plates. A carrier gas is fed into a mass of metal-organic precursors through a feed tube which is connected with the bottom of the bubbler body. The exhaust tube is set away from the mass of metal-organic precursors and drains the carrier gas passing through the precursors. The compressing plate has many holes and is movable up and down along the wall of the bubbler body so that it may be positioned according to the amount of the precursors. The upper porous thin plate is located between the exhaust tube and the compressing plate, and the lower porous thin plate is located above the leading end of the feed tube, giving support to the mass of the metal-organic precursors. That is, the precursors are placed on the lower porous thin plate and there is a room between the lower porous thin plate and the bottom of the bubbler body.

17 Claims, 5 Drawing Sheets

BUBBLER FOR SOLID METAL-ORGANIC PRECURSORS

BACKGROUND OF THE INVENTION

1. Field of the Invention

The present invention relates, in general, to a bubbler for solid metal-organic precursors and, more particularly, to a bubbler with porous thin plates, improved in feeding efficiency of metal-organic precursors and in precision of controlling the concentration of metal-organic precursors.

2. Description of the Prior Art

In metal-organic chemical vapor deposition (hereinafter referred to as "MOCVD") processes, metal-organic precursors are generally fed in such a manner that they are vaporized at a suitable temperature and then, the vaporized precursors are transferred into a separate reactor by a carrier gas. Herein, the feed rate of the precursors is determined by three parameters, temperature and pressure inside a bubbler and the flow rate of the carrier gas, with the proviso that the contact area between the precursors and the carrier gas should be constant. However, as the reaction time progresses, the contact area is changed in practical bubblers. Hence, it is very difficult to control precisely the feed rate of precursors only with the above three parameters.

In order to better understand the background of the invention, a description for of conventional bubblers will be given below, in connection with some drawings.

Referring initially to FIG. 1A, there is shown a bubbler for metal-organic precursors, comprising a bubbler body 1a, a carrier gas feed tube 1b, and an exhaust tube 1c. As shown in FIG. 1A, bubbler body 1a contains liquid precursor and one end of carrier gas feed tube 1b is dipped in the liquid precursor. On the other hand, exhaust tube 1c is away from the surface of the liquid. FIG. 1B shows the case that the bubbler is charged with a mass of solid metal-organic precursors. After the bubbler is operated for a certain time, there is generated a tunnel 1f, a path through which the carrier gas moves in the mass of solid metal-organic precursors. The width and depth of the tunnel change with the lapse of time, which seriously affects the contact area between a precursor 1e and the carrier gas. Thus, the reaction gas exhausted from exhaust tube 1c carries precursors having a variable composition. Consequently, the conventional bubbler is virtually incapable of precisely controlling the concentration of the precursors in a reaction gas which is fed into the separate reactor. In addition, the bubbler is disadvantageous in that a good deal of residual precursors 1e is disused because the bubbler should be newly exchanged when the tunnel pierces the precursors in the bubbler.

Referring to FIG. 24, there is shown another bubbler which is made in consideration of the above problems. In contrast with the bubbler shown in FIG. 1A, the bubbler of FIG. 2A has a carrier gas feed tube 2b which is separated from a mass of precursors 2e and an exhaust tube 2c the one end of which is buried in the mass. In this bubbler, a tunnel 2f is also formed but it has a wide width as shown in FIG. 2B and takes a longer time for the tunnel to pierce the mass. Thus, the bubbler of FIG. 2A is improved in duration and consistency of the reaction gas. However, the problems encountered in the bubbler of FIG. 1A cannot be absolutely solved for it is impossible to prevent the formation of the tunnel.

With reference to FIG. 3A, there is shown a further bubbler comprising a bubbler body 3a, a carrier gas feed tube 3b, an exhaust tube 3c and a compressing plate 3d. This bubbler is the same as that of FIG. 2A, except for compressing plate 3d. Likewise, feed tube 3b is located away from a mass of precursors and one end of exhaust tube 3c is buried in the mass. The characteristic element, compressing plate 3d, has many holes and is movable up and down along exhaust tube 3c. Supported by exhaust tube 3c, it is positioned appropriately according to the amount of metal-organic precursor 3e charged. The role of compressing plate 3d is to press precursor 3e by its own weight, expecting that tunnels 3f might be not generated inside the mass of metal organic precursor 3e. However, this bubbler is still defective because the weight of compressing plate 3d is limited and the generation of the tunnel cannot be prevented.

SUMMARY OF THE INVENTION

It is therefore a primary object of the present invention to overcome the problems encountered in the prior art and to provide a bubbler for solid metal-organic precursors, wherein tunnel generation is prevented and reliability and reproductivity for a constant feed rate of metal-organic precursors are enhanced.

It is another object of the present invention to provide a bubbler for solid metal-organic precursors, capable of minimizing the amount of residual precursors.

It is a further object of the present invention to provide a bubbler for solid metal-organic precursors, protective of facilities relating to bubblers by preventing precursors in solid phase from entering the facilities.

Based on the intensive and thorough study by the present inventor, the above objects are accomplished by the provision of a bubbler containing solid precursor which is used for deposition processes, comprising: a bubble body containing a hole at the feed bubbler body bottom through which carrier gas enters the bubbler; an exhaust hole at the upper part of the bubbler body through which gas exits the bubbler body, the precursor which exhaust hole is located above; and a means for passing gas evenly to provide said precursor at constant rate wherein said means for passing gas is located under the precursor and spaced from said bubbler body bottom.

In accordance with the present invention, the bubbler containing solid precursor further comprises a further means for passing gas evenly to provide said precursor at constant rate wherein said means for passing gas is located above the precursor and under the exhaust hole.

In accordance with the present invention, the bubbler containing solid precursor further comprises a means for pressing the precursor by its weight wherein said means for pressing the precursor is located above the precursor.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE INVENTION

The application of the preferred embodiment of the present invention is best understood with reference to the accompanying drawings.

Figure 1A:
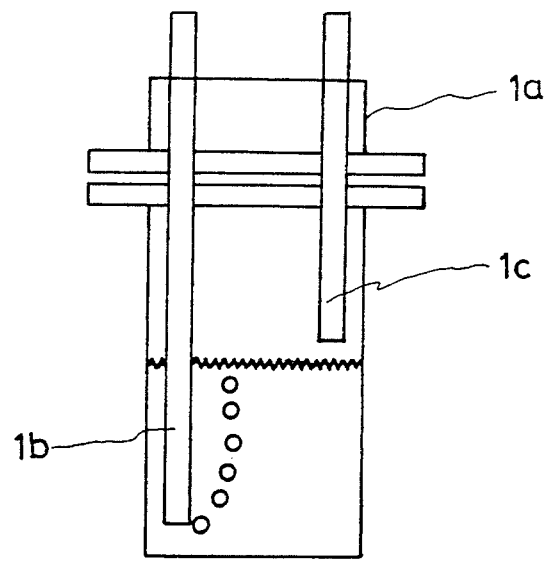
FIG. 1A is a schematic longitudinal section showing a conventional bubbler for solid metal-organic precursors.
Figure 1B:
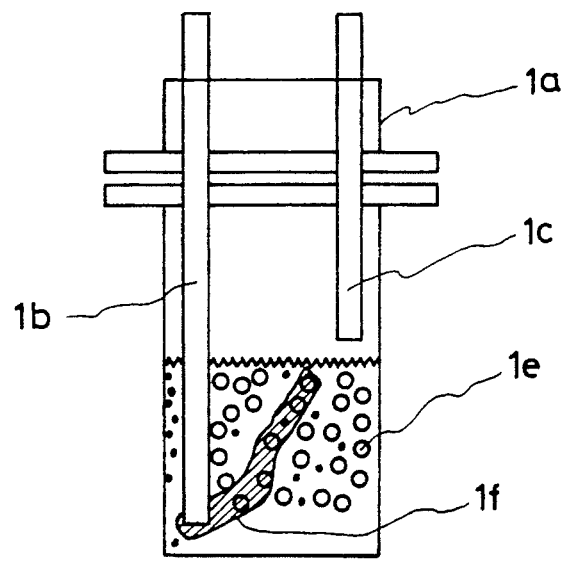
FIG. 1B is a schematic longitudinal section showing an operating state when solid metal-organic precursors are used in the bubbler of FIG. 1A.
Figure 2A:
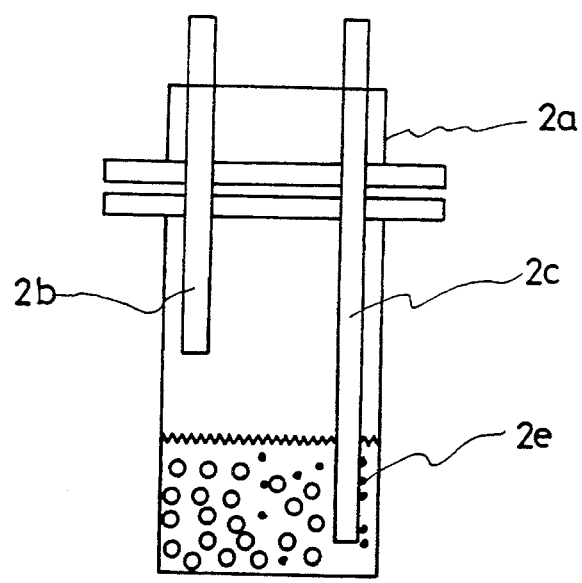
FIG. 2A is a schematic longitudinal section showing another conventional bubbler.
Figure 2B:
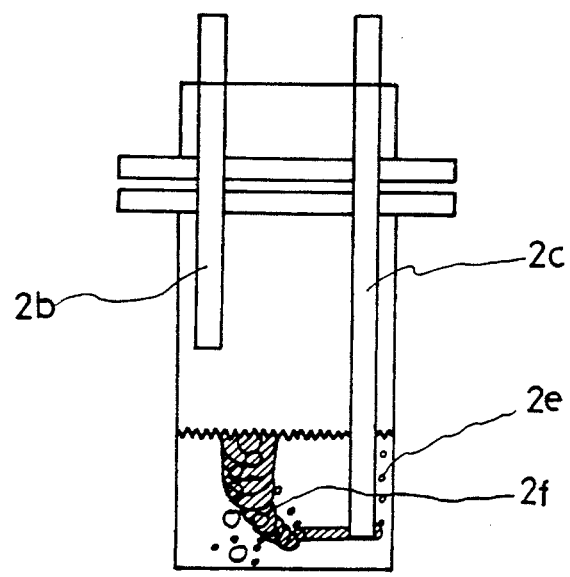
FIG. 2B is a schematic longitudinal section showing an operating state when solid metal-organic precursors are used in the bubbler of FIG. 2A.
Figure 3A:
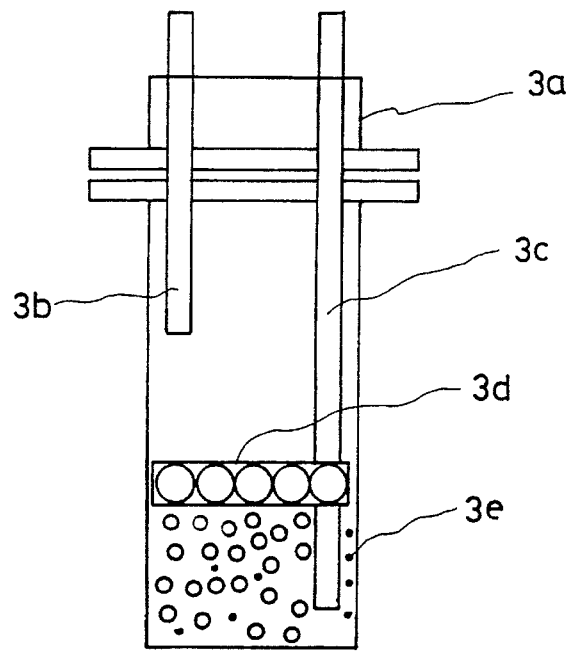
FIG. 3A is a schematic longitudinal section showing a further conventional bubbler.
Figure 3B:
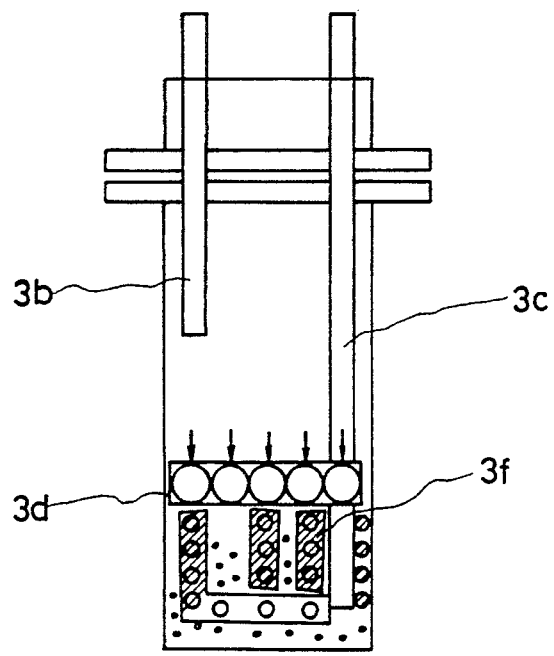
FIG. 3B is a schematic longitudinal section showing an operating state when solid metal-organic precursors are used in the bubbler of FIG. 3A.
Figure 4A:
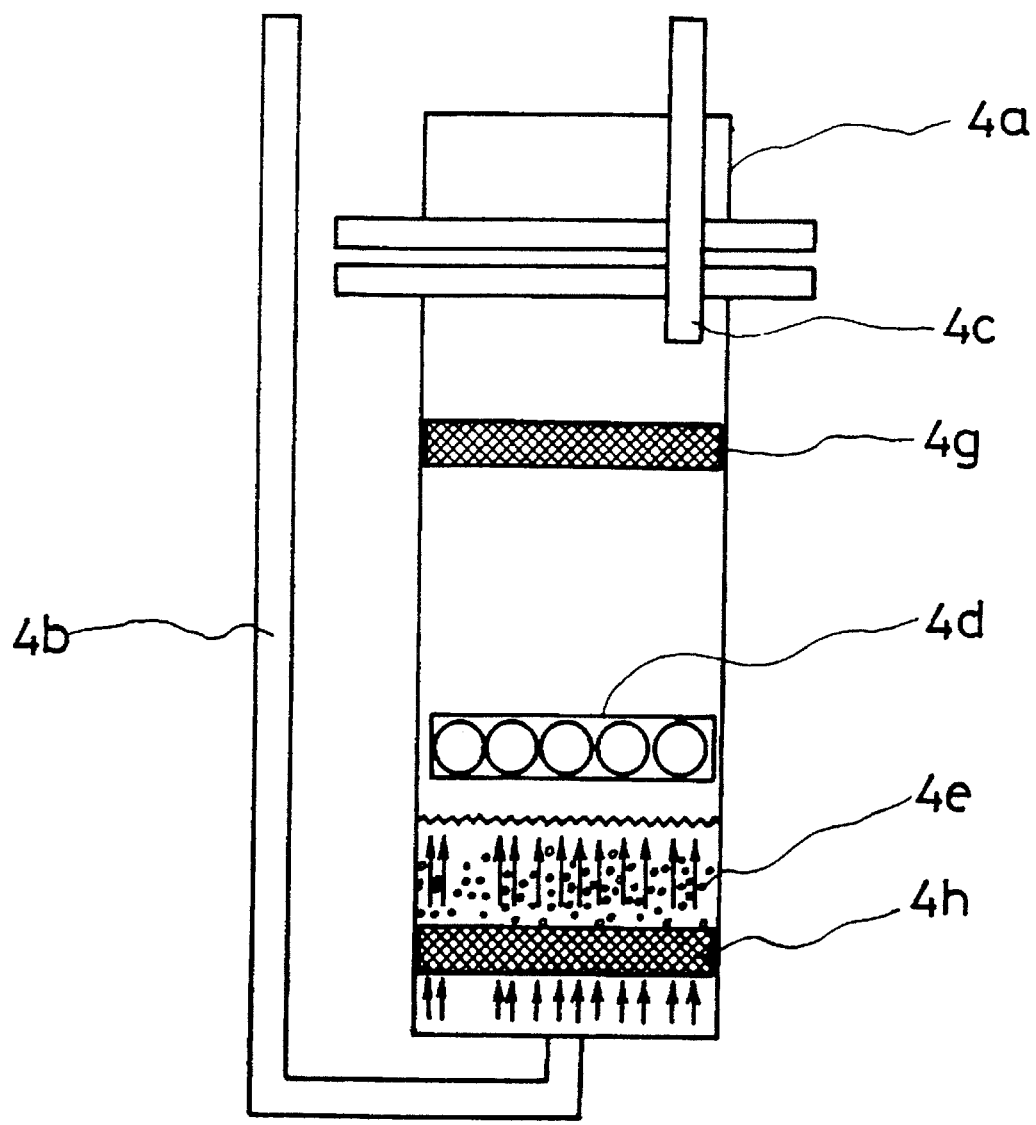
FIG. 4A is a schematic longitudinal section showing a bubbler for solid metal-organic precursors, according to the present invention.

Referring to FIG. 4A, there is shown a bubbler for solid metal-organic precursors, according to the present invention. As shown in this figure, the bubbler comprises a bubbler body 4a, a carrier gas feed tube 4b, an exhaust tube 4c, a compressing plate 4d and a pair of porous thin plates 4g, 4h. A carrier gas is fed into a mass of metal-organic precursors 4e through feed tube 4b which is connected with the bottom of bubbler body 4a. Exhaust tube 4c is set away from the mass of metal-organic precursors and drains the carrier gas passing through the precursors. Pressing the mass of precursors by its own weight, compressing plate 4d with many holes is movable up and down along the wall of the bubbler body so that it may be positioned according to the amount of the precursors.

As for the porous thin plates characteristic to the invention, upper porous thin plate 4g is located between exhaust tube 4c and compressing plate 4d, and lower porous thin plate 4h is located above the leading end of feed tube 4b, giving support to the mass of the metal-organic precursors. That is, the precursors are placed on lower porous thin plate 4h and there is a space between lower porous thin plate 4h and the bottom of the bubbler body 4a. The porous thru plates can be manufactured by sintering or mesh junction of metal powders.

Pores in lower porous thin plate 4h should have a size on average that is not more than that of the metal-organic precursors charged in the bubbler body 4a. In case of the upper plate 4g, the pores can be larger than that in lower porous thin plate 4h, according to the shape and structure of the pores.

Figure 4B:
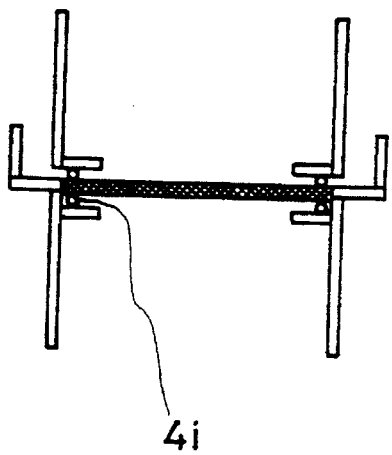
FIGS. 4B and 4C are schematic partial detail views showing the sealing a of bubbler body.
Figure 4C:
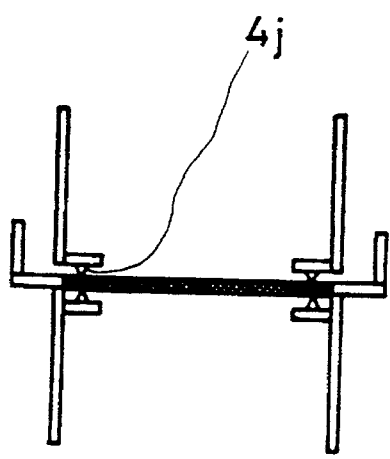

The porous thin plates 4g, 4h are designed to be readily detachable from the bubbler body 4a for a need of washing them. In addition, the plates 4g, 4h must closely fit the inner diameter of the bubbler body 4a in order to prevent the carrier gas from running out. In this regard, O-rings 4i or a metallic gasket 4j are used, as shown in FIGS. 4B and 4C. O-rings 4i are attached to both the upper and lower surfaces of the porous thin plates (shown in FIG. 4B). Likewise, metallic gasket 4j is also attached to both the upper and lower surfaces of the porous thin plates (shown in FIG. 4C). The former is used in the case that the temperature in bubbler body 4a is on the order of about 70° to about 300° C., whereas the latter is used when above 300° C.

It is important to note the roles that the two porous thin plates 4g, 4h play in the bubbler body 4a when solid metal-organic precursors are volatilized by using the bubbler of the present invention. The carrier gas passing through feed tube 4b enters the space formed between the bottom of bubbler body 4a and lower porous thin plate 4h and is advanced through lower porous thin plate 4h to the precursors 4e. In contrast with the cases of the above-mentioned conventional bubblers, the carrier gas coming out feed tube 4b does not readily contact the precursors 4e. It stays in the space for a short time and becomes widespread therein. Then, the carrier gas penetrates through lower porous thin plate 4h uniformly into the mass of precursors 4e above lower porous thin plate 4h. In other words, the presence of lower porous thin plate 4h enables the carrier gas to be provided uniformly to a mass of precursors thereby preventing uneven gas distribution biased toward the carrier gas inlet. Accordingly, a carrier gas tunnel in the mass of precursors 4e does not occur. This uniform distribution of carrier gas also brings about an additional effect that the contact area between precursors and carrier gas can be kept constant, preventing variation of the precursor feed rate with time. Further, the precursors are consumed uniformly over the bubbler, so that residual precursors can be minimized.

In the meanwhile, the position of upper porous thin plate 4g is set with the aim of preventing solid metal-organic precursors from entering downstream facilities, such as a main reactor, pipe arrangements and other parts. When a carrier gas is rapidly fed into the bubbler body 4a, solid phase metal-organic precursors are likely to enter these facilities, like powders blowing in the wind, before they are volatilized. In particular, when, after recharge of fresh precursors, pumping is initiated for reducing pressure inside the bubbler or when the feed of carrier gas is initiated for manufacturing thin films, a gas with a high pressure rushes into the bubbler, giving rise to powder which may be inhaled. This can be completely prevented by upper porous thin plate 4g.

As described hereinbefore, the two porous thin plates 4g, 4h, mounted at an upper location and a lower location inside the bubbler respectively, bring a remarkable improvement in reliability and reproductivity into the feed rate of metal-organic precursors when solid metal-organic precursors are volatilized to be provided into a main reactor. In addition, the bubbler according to the present invention is very economical because residual precursors can be minimized by the ability of the lower porous thin plate 4h to distribute the precursors uniformly over the bubbler. Further, a backward flow of precursor and a powder-blowing phenomenon which are caused by instant aneous large pressure differences inside the bubbler are no longer problematic because of the presence of the upper porous thin plate 4g, thereby protecting downstream facilities relating to metal-organic deposition.

Other features, advantages and embodiments of the present invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A bubbler containing solid precursors for use in a deposition process, comprising:

a bubbler body containing a feed hole at the bubbler body bottom through which a carrier gas enters the bubbler, an exhaust hole at the upper part of said bubbler body through which said career gas exits the bubbler body, which exhaust hole is located above the precursors; and a means for passing said carrier gas through the precursors evenly to transfer said precursors through the bubbler at constant rate wherein said means for passing the carrier gas is located under the precursors and spaced from said bubbler body bottom.

2. A bubbler in accordance with claim 1, further comprising a further means for passing said carrier gas through the precursors evenly to transfer said precursors through the bubbler at constant rate wherein said further means for passing the carrier gas is located above the precursors and under said exhaust hole.

3. A bubbler in accordance with claim 1, further comprising a means for pressing the precursors by its weight wherein said means for pressing the precursors is located above the precursors.

4. A bubbler in accordance with claim 1, wherein said means for passing the carrier gas is a porous thin plate.

5. A bubbler in accordance with claim 2, wherein said further means for passing the carrier gas is a porous thin plate.

6. A bubbler in accordance with claim 4, wherein said porous thin plate has a plurality of pores having diameters not more than that of particles of the precursors.

7. A bubbler in accordance with claim 4, wherein said porous thin plate is detachably mounted inside said bubbler body.

8. A bubbler in accordance with claim 5, wherein said porous thin plate is detachably mounted inside said bubbler body.

9. A bubbler in accordance with claim 4, wherein said porous thin plate is sealingly mounted inside the bubbler body.

10. A bubbler in accordance with claim 5, wherein said porous thin plate is sealingly mounted inside the bubbler body.

11. A bubbler in accordance with claim 4, wherein said porous thin plate is sealingly mounted by an O-ring.

12. A bubbler in accordance with claim 5, wherein said porous thin plate is sealingly mounted by an O-ring.

13. A bubbler in accordance with claim 4, wherein said porous thin plate is sealingly mounted by a metallic gasket disposed around the periphery of the porous thin plate.

14. A bubbler in accordance with claim 5, wherein said porous thin plate is sealingly mounted by a metallic gasket disposed around the periphery of the porous thin plate.

15. A bubbler containing solid precursors for use in a deposition process, comprising:

a bubbler body containing a feed hole at the bubbler body bottom through which a carrier gas enters the bubbler;

an exhaust hole located above the precursors and at the upper part of said bubbler body; and a porous thin plate located under the precursors and spaced from the bubbler body bottom for passing said carrier gas evenly to transfer said precursors through the bubbler at constant rate wherein said plate is spaced from the bubbler body bottom.

16. A bubbler in accordance with claim 15, further comprising a porous thin plate for passing gas evenly to provide said precursors at constant rate wherein said plate is located above the precursors and under the exhaust hole.

17. A bubbler in accordance with claim 15, further comprising a plate for pressing the precursors by its weight wherein said plate is located above the precursors.

\* \* \* \* \*